US009003369B2

(12) United States Patent
Overby

(10) Patent No.: US 9,003,369 B2
(45) Date of Patent: Apr. 7, 2015

(54) HDMI-MUXED DEBUG PORT METHODS AND APPARATUSES

(75) Inventor: Mark Alan Overby, Bothell, WA (US)

(73) Assignee: Nvidia Corporation, Santa Clara, CA (US)

( * ) Notice: Subject to any disclaimer, the term of this patent is extended or adjusted under 35 U.S.C. 154(b) by 193 days.

(21) Appl. No.: 13/222,979

(22) Filed: Aug. 31, 2011

(65) Prior Publication Data

US 2013/0054842 A1 Feb. 28, 2013

(51) Int. Cl.

| | |
|---|---|
| ***H02G 3/00*** | (2006.01) |
| ***G06F 9/44*** | (2006.01) |
| ***H05K 7/10*** | (2006.01) |
| ***G09G 5/00*** | (2006.01) |

(52) U.S. Cl.

CPC ........ *G09G 5/008* (2013.01); *G09G 2300/0426* (2013.01); *G09G 2370/047* (2013.01); *G09G 2370/12* (2013.01); *G09G 2370/22* (2013.01)

(58) Field of Classification Search

None

See application file for complete search history.

(56) References Cited

U.S. PATENT DOCUMENTS

| | | | |
|---|---|---|---|
| 4,524,440 | A | 6/1985 | Orsic |
| RE32,900 | E | 4/1989 | Orsic |
| 5,453,983 | A | 9/1995 | O'Connell et al. |
| 5,634,069 | A | 5/1997 | Hicok et al. |
| 5,703,883 | A | 12/1997 | Chen |
| 5,754,957 | A | 5/1998 | Khan |
| 5,875,190 | A | 2/1999 | Law |
| 6,005,863 | A | 12/1999 | Deng et al. |
| 6,023,732 | A | 2/2000 | Moh et al. |
| 6,088,822 | A | 7/2000 | Warren |
| 6,199,150 | B1 | 3/2001 | Yoshikawa |
| 6,351,725 | B1 | 2/2002 | Willis et al. |
| 6,480,488 | B1 | 11/2002 | Huang |
| 6,526,535 | B1 | 2/2003 | Warren |
| 6,715,023 | B1 | 3/2004 | Abu-Lebdeh et al. |
| 6,724,759 | B1 | 4/2004 | Chang et al. |
| 6,738,881 | B1 | 5/2004 | Ollivier et al. |
| 6,741,575 | B1 | 5/2004 | Zhang et al. |
| 7,039,771 | B1 | 5/2006 | Spaur et al. |
| 7,050,859 | B1 | 5/2006 | Govindaraj et al. |
| 7,151,893 | B2 | 12/2006 | Hayashi et al. |
| 7,421,518 | B2 | 9/2008 | Toda |
| 7,441,056 | B2 | 10/2008 | Lee |

(Continued)

OTHER PUBLICATIONS

Leonard Tsai (Hewlett-Packard Company), "HDMI-based debug module", Copyright Jan. 2011, Research Disclosure, pp. 1-2.*

(Continued)

*Primary Examiner* — Idriss N Alrobaye
*Assistant Examiner* — Dayton Lewis-Taylor

(57) ABSTRACT

The muxed HDMI debug port methods and apparatuses are directed toward means for detecting an extended display identification data (EDID) code indicating a debug cable or debug host device coupled to the high-definition multimedia interface (HDMI) port of a computing device. In addition, the methods and apparatuses include means for disabling a display data channel (DDC) bus of the high-definition multimedia interface (HDMI) port in response to the extended display identification data (EDID) code indicating the debug cable or debug host device. Furthermore, the method and apparatuses include means for transmitting and receiving debug commands and data on a serial input (RXD) and serial output (TXD) of the high-definition multimedia interface (HDMI) port in response to the extended display identification data (EDID) code indicating the debug cable or debug host device.

14 Claims, 4 Drawing Sheets

(56) References Cited

U.S. PATENT DOCUMENTS

| | | | | |
|---|---|---|---|---|
| 7,457,311 | B2 | 11/2008 | Hall | |
| 7,468,975 | B1 | 12/2008 | Davis | |
| 7,917,671 | B2 | 3/2011 | Chilukoor et al. | |
| 8,856,744 | B2 | 10/2014 | Overby | |
| 2004/0027515 | A1 | 2/2004 | Itakura | |
| 2005/0182876 | A1 | 8/2005 | Kim et al. | |
| 2006/0031611 | A1 | 2/2006 | Konda | |
| 2006/0187837 | A1 | 8/2006 | Warren et al. | |
| 2006/0277586 | A1 | 12/2006 | Baba et al. | |
| 2006/0282567 | A1 | 12/2006 | Bhesania et al. | |
| 2006/0288131 | A1 | 12/2006 | Lee | |
| 2008/0134237 | A1* | 6/2008 | Tu et al. | 348/734 |
| 2008/0320186 | A1 | 12/2008 | Lee | |
| 2009/0213129 | A1* | 8/2009 | Li | 345/544 |
| 2010/0020183 | A1* | 1/2010 | Kimoto et al. | 348/207.11 |
| 2011/0242427 | A1* | 10/2011 | Ramsdale | 348/714 |
| 2012/0064758 | A1 | 3/2012 | Grice et al. | |

OTHER PUBLICATIONS

ON Semiconductor, "HDMI Receiver Port Protection and Interface Device", Copyright Jul. 2011—Rev. 7, Semiconductor Components Industries, LLC, pp. 1-12.*

Xilinx, Inc., "XPS 16550 UART (v3.00a)—Product Specification", Sep. 16, 2009, pp. 1-25.*

Debugging—Wikipedia, the free encyclopedia, Aug. 23, 2011, http://web.archive.org/web/20110913013559/http://en.wikipedia.org/wiki/De- bugging.

Digital Visual Interface—Wikepedia, the three encyclopedia, Feb. 9, 2010, http://web.archive.org/web/20100209004631/http://en.wikipedia.org/wiki/Di- gital.sub.-Visual.sub.-Interface.

"Communication interface circuit for on-line emulation and debugging, has set of sending/receiving switching channels in protocol level shifter circuit, and channel's output end connected with serial port's data receiving terminal" CN 200976142 Y, Nov. 14, 2007.

* cited by examiner

HDMI-MUXED DEBUG PORT METHODS AND APPARATUSES

BACKGROUND OF THE INVENTION

Computing devices have made significant contributions toward the advancement of modern society and are utilized in a number of applications to achieve advantageous results. Numerous devices, such as personal computers, laptop computers, tablet computers, smart phones and the like are directed toward specific markets and applications. For example, there are relatively large desktop personal computers for use in home and office. The desktop PCs are generally able to operate with a large number of external peripheral devices, such as monitors, keyboards, pointing devices, printers, cameras, speakers and the like. Desktop PCs are generally adapted to be readily expanded and/or upgraded. Laptop computers, tablet computers and smart phones provide increasing portability but generally are adapted to support fewer external peripheral devices, particularly at any given time and it generally is more difficult to upgrade or expand the devices.

Most conventional computing devices include a plurality of ports for communicating with one or more peripheral device and/or one or more other devices. For example, a conventional laptop computer may include an HDMI port, a DVI port, a plurality of USB ports, an Ethernet port, a WIFI transceiver, and/or the like. A conventional tablet computer may include one HDMI port, one USB port, a WIFI transceiver and/or the like. Typically, the smaller the form fact of the computing device, the less communication ports are included.

Usually one or more peripherals such as a keyboard, a pointing device, speakers, a camera, a storage device and the like are coupled to the computing device through the USB port of the computing device. At times the operation of the computing device or between the computing device and one or more USB coupled peripheral device, and/or software running on the computing device or USB peripheral may experience problems. In a conventional computing device having a plurality of USB ports, one of the ports may be used to debug the problem. In such case, one USB port can be used for normal USB operations while a debug platform can be coupled to another USB port for debugging the software or hardware of the computing device.

SUMMARY OF THE INVENTION

The present technology may best be understood by referring to the following description and accompanying drawings that are used to illustrate embodiments of the present technology.

Embodiments of the present technology are directed toward multiplexing debug commands and data on a high-definition multimedia interface (HDMI) when a computing device includes a single universal serial bus (USB). In one embodiment, the computing device includes a high-definition multimedia interface (HDMI) port, a high-definition multimedia interface (HDMI) module, and a universal asynchronous receiver and transceiver (UART). The high-definition multimedia interface (HDMI) module is adapted to detect an extended display identification data (EDID) code indicating a debug cable or debug host device coupled to the high-definition multimedia interface (HDMI) port. The high-definition multimedia interface (HDMI) module is also adapted to disable a display data channel (DDC) bus of the high-definition multimedia interface (HDMI) port in response to the extended display identification data (EDID) code indicating the debug cable or debug host device. The universal asynchronous receiver and transceiver (UART) is adapted to transmit and receive debug commands and data on a serial input (RXD) and serial output (TXD) of the high-definition multimedia interface (HDMI) port in response to the extended display identification data (EDID) code indicating the debug cable or debug host device.

In another embodiment, a high-definition multimedia interface (HDMI) controller includes a high-definition multimedia interface (HDMI) module and a universal asynchronous receiver and transceiver (UART). The high-definition multimedia interface (HDMI) module is adapted to detect a hot plug detect signal, to detect an extended display identification data (EDID) code indicating a debug cable or debug host device in response to the hot plug detect signal, and to disable a display data channel (DDC) bus in response to the extended display identification data (EDID) code indicating the debug cable or debug host device. The universal asynchronous receiver and transceiver (UART) is adapted to transmit and receive debug commands and data on a serial input (RXD) and serial output (TXD) in response to the extended display identification data (EDID) code indicating the debug cable or debug host device.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
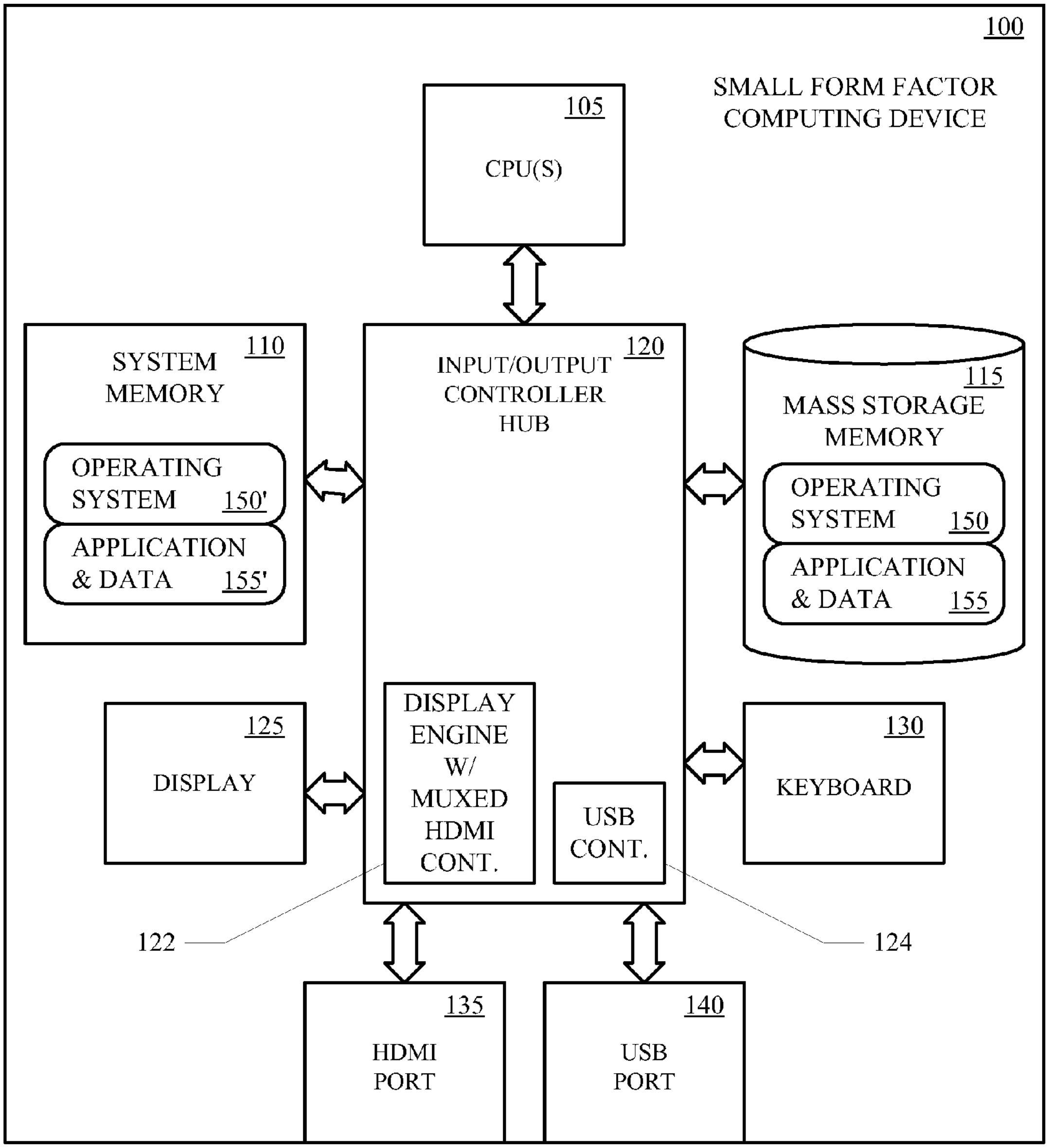
FIG. 1 shows a block diagram of an exemplary computing device, in accordance with one embodiment of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as “receiving,” and/or the like, refer to the actions and processes of an electronic device such as an electronic computing device that manipulates and transforms data. The data is represented as physical (e.g., electronic) quantities within the electronic device’s logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to “the” object or “a” object is intended to denote also one of a possible plurality of such objects. It is also to be understood that the phraseology and terminology used herein is for the purpose of description and should not be regarded as limiting.

Embodiments of the present technology are directed toward using an HDMI port of a device having a single USB port to allow debugging by a second computing device. The techniques multiplex the use of the HDMI port to allow debugging of the device without increasing the number of USB ports.

Referring now to FIG. 1, an exemplary computing device, in accordance with one embodiment of the present technology, is shown. The exemplary computing platform may include one or more central processing units (CPUs) 105, one or more graphics processing units (GPUs) (not shown), volatile and/or non-volatile memory (e.g., computer readable media) 110, 115, a input/output controller hub 120, one or more internal peripheral devices 125, 130, one or more HDMI ports 134, and a single USB port communicatively coupled by one or more busses. The input/output controller hub 120 is adapted to communicate data and instructions between the CPU 105, the computing device-readable media 110, 115, the one or more internal peripheral devices 125, 130, the one or more HDMI ports 134, and the single USB port. The internal peripheral devices 125, 130 may include a display 125, a keyboard 130, a pointing device, a speaker, a microphone, a wireless network radio (e.g., WIFI card) and/or the like.

The computing device-readable media 110, 115, may be characterized as primary memory and secondary memory. Generally, the secondary memory, such as a solid state (e.g., flash memory), magnetic and/or optical mass storage, provides for non-volatile storage of computer-readable instructions and data for use by the computing device. For instance, the flash memory drive 115 may store the operating system (OS) 150, applications (e.g., programs, drivers, routines, utilities) and data 155. The primary memory, such as the system memory 110 and/or graphics memory (not shown), provides for volatile storage of computer-readable instructions and data for use by the computing device. For instance, the system memory 110 may temporarily store all or a portion of the operating system 150', and all or a portion of one or more applications and associated data 155' that are currently used by the CPU 105, GPU and the like.

Figure 2:
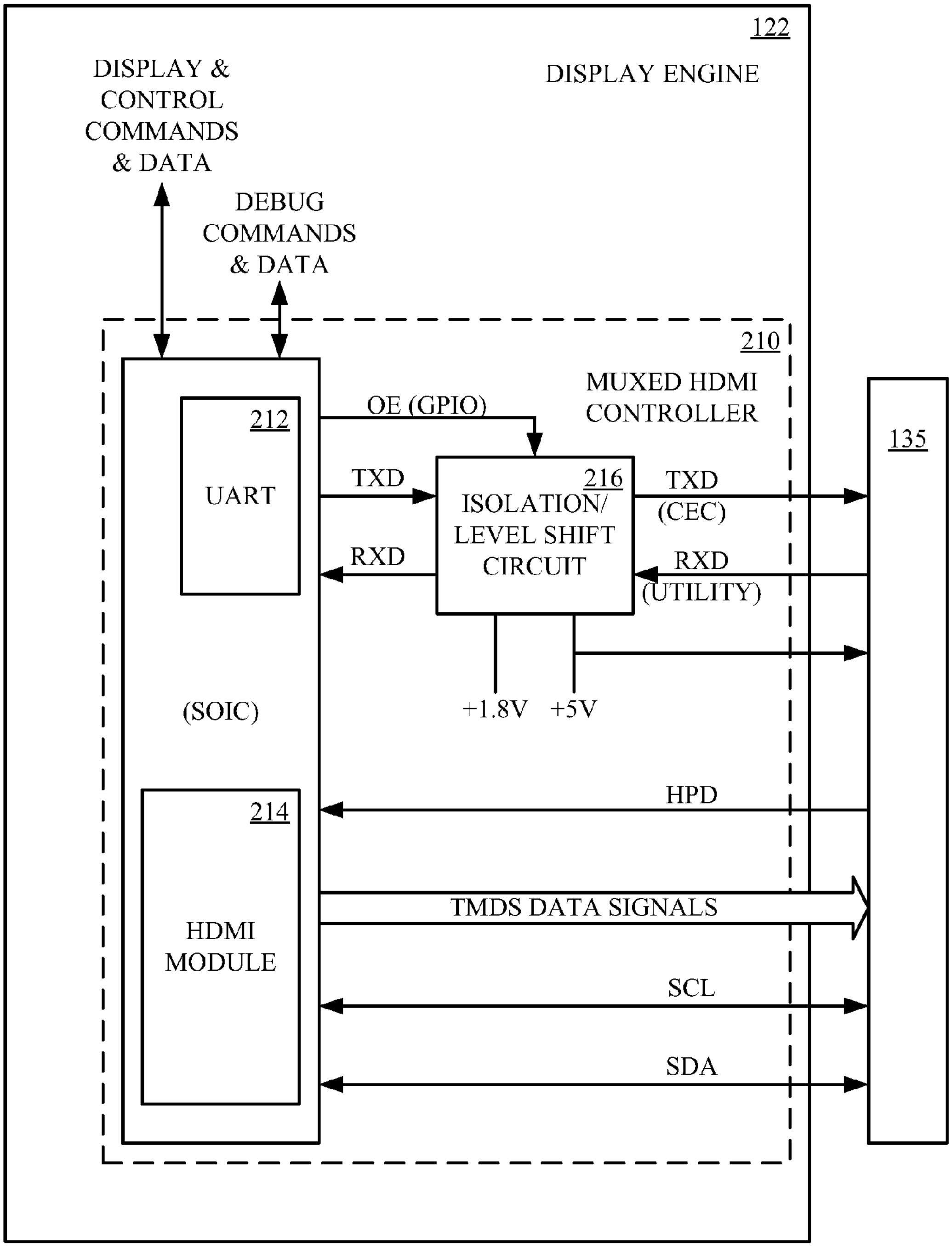
FIG. 2 shows a block diagram of a display engine with muxed HDMI controller, in accordance with one embodiment of the present technology.

The input/output controller hub 120 may be implemented as an integral sub-circuit (e.g., single IC chip), or as one or more sub-circuits (e.g., a plurality of IC chips, such as a north and south bridge chip set). The input/output controller hub 120 may include a display engine 122, a USB controller 124, memory controllers, other peripheral controllers, and/or the like. The display engine 120 may include a muxed HDMI controller 122. The muxed HDMI controller 122 may be implemented as a single sub-circuit (e.g., system-on-a-chip (SOIC)) or as one or more sub-circuit. Referring now to FIG. 2, a display engine 122 with muxed HDMI controller 210, in accordance with one embodiment of the present technology, is shown. The muxed HDMI controller 210 may include a universal asynchronous receiver/transmitter (UART) 212, an HDMI module 214 and an isolation/level shifter circuit 216. It is appreciated that the muxed HDMI controller 210 may be implemented by one or more separate and/or integral sub-circuits. For example, the UART 212 and HDMI module 214 may be implemented by a system-on-an-integrated-circuit (SOIC), while the isolation/level shifter circuit 216 may be implemented by a separate integrated circuit, such as Texas Instrument’s TX0102 voltage translation circuit IC. The circuit isolation and/or signal level shifting of the isolation/level shifter circuit 216 may be controlled by an output enable signal from the UART 212. However, it is further appreciated that the functional blocks of the muxed HDMI controller 210 may be implemented in any other of a number of arrangements of separate and/or integral sub-circuits in accordance with embodiments of the present technology.

In accordance with the applicable standards. the HDMI controller provides connections at the HDMI port 135 that include a consumer electronics control (CEC) line (e.g., serial output (TXD)), a serial input (RXD) (also known as the reserved, utility or HEC- according to the FIDMI standard), ground (not shown) and power lines, a hot plug detect line, a display data channel bus e.g., transition minimized differential signaling (TMDS) lines), and serial clock line (SCL) and serial data lines (SDA). The muxed HDMI controller 210 may transmit and receive display and control commands and data through the HDMI port 135 in accordance with the conventional EIDMI standards.

The muxed HDMI controller 210 is also adapted to transmit and receive debugging commands and data through the HDMI port 135. When the HDMI module 214 detects a hot plug device signal on the HPD line, the HDMI module 214 reads extended display identification data (EDID) across the SCL and SDA lines. If the EDID is a unique code indicating a “debug” cable or host device, the HDMI module 214 disables (e.g., high impedance state) the display data channel bus (e.g., transition minimized differential signaling (TMDS) lines). Thereafter, the debug commands and data are transmitted and received across the serial input (RXD) and output (TXD) lines of the HDMI port 135 by the UART 212 and isolation/level shifter circuit 216.

To conserve power when not debugging, the serial input (RXD) and output (TXD) lines are left in a high impedance state, and the line level is typically used at 1.8V, although any voltage is usable. If another line level is appropriate, the signals on the serial input (RXD) and output (TXD) lines are line leveled with one of the other voltages commonly used by the HDMI connector for these pins. To avoid incompatibility with a conventional HDMI cable assembly that is being inserted into the socket, the outputs of the isolation/level shifter circuit 216 are held in a high impedance state until such time as the muxed HDMI controller 210 enables the debugging state.

Figure 3:
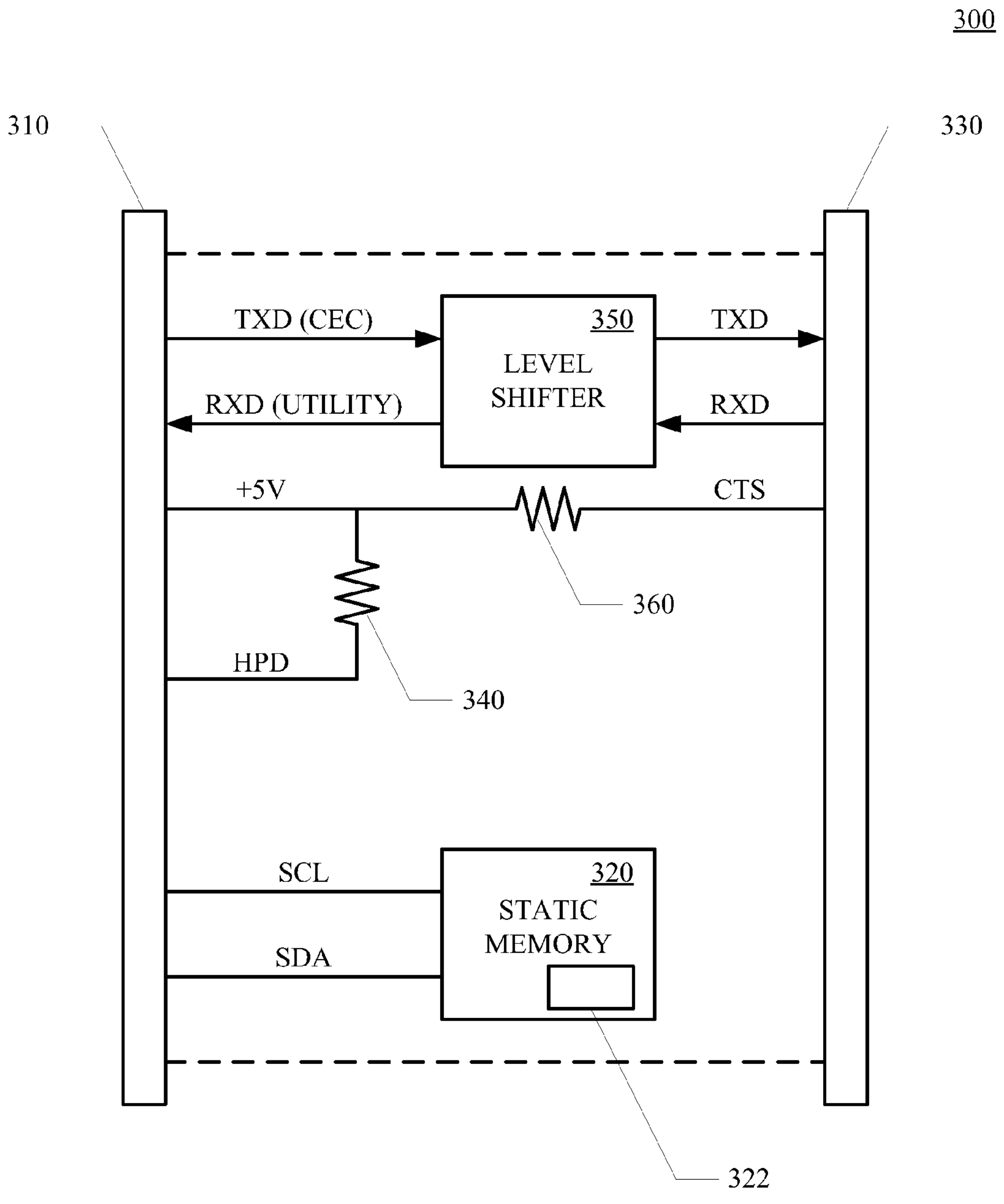
FIG. 3 shows a block diagram of a HDMI cable adapted for debugging, in accordance with one embodiment of the present technology.

Referring, now to FIG. 3, a block diagram of a HDMI cable assembly adapted for debugging, in accordance with one embodiment of the present technology, is shown. The HDMI cable includes an HDNI connector 310, a consumer electronics control (CEC) line (e.g., serial output (TXD)), a serial input (RXD), ground (not shown) and power (e.g., +5V) lines, a hot plug detect (HPD) line, SCL and SDA lines, static memory 320 and a debug connector 330. The HPD line is coupled to provide a pull-up 340 to the power line. In one implementation, a resistive element may provide the pull-up 340 from the HPD line to the power line. The static memory 320, such as a 12C EEPROM or ROM, is coupled to the SCL and SDA lines. The static memory 320 includes a unique EDID code 322 indicating a. "debug" host mode/device. The HDMI cable may optionally include a level shifter circuit 350 in the consumer electronics control (CEC) line (e.g., serial output (TXD)) and the serial input (RXD) line. The optional level shifter circuit 340 is adapted to translate the voltage line levels from one logic level to another. One or more lines of the cable may optionally include short circuit protection 360, such as a resistive element. The debug connector 330 may be any conventional connector, such as a DB-9 connector, for coupling to a host debugging computing, system. If the cable is designed for use with a TTL compatible serial device such as another UART, then the signals could he passed through the cable without further electrical modification. In another implementation, a RS232 level convener can be used such that the serial connection is then made available with personal computer (PC) compatible signaling levels still using passive components that require no configuration.

Figure 4:
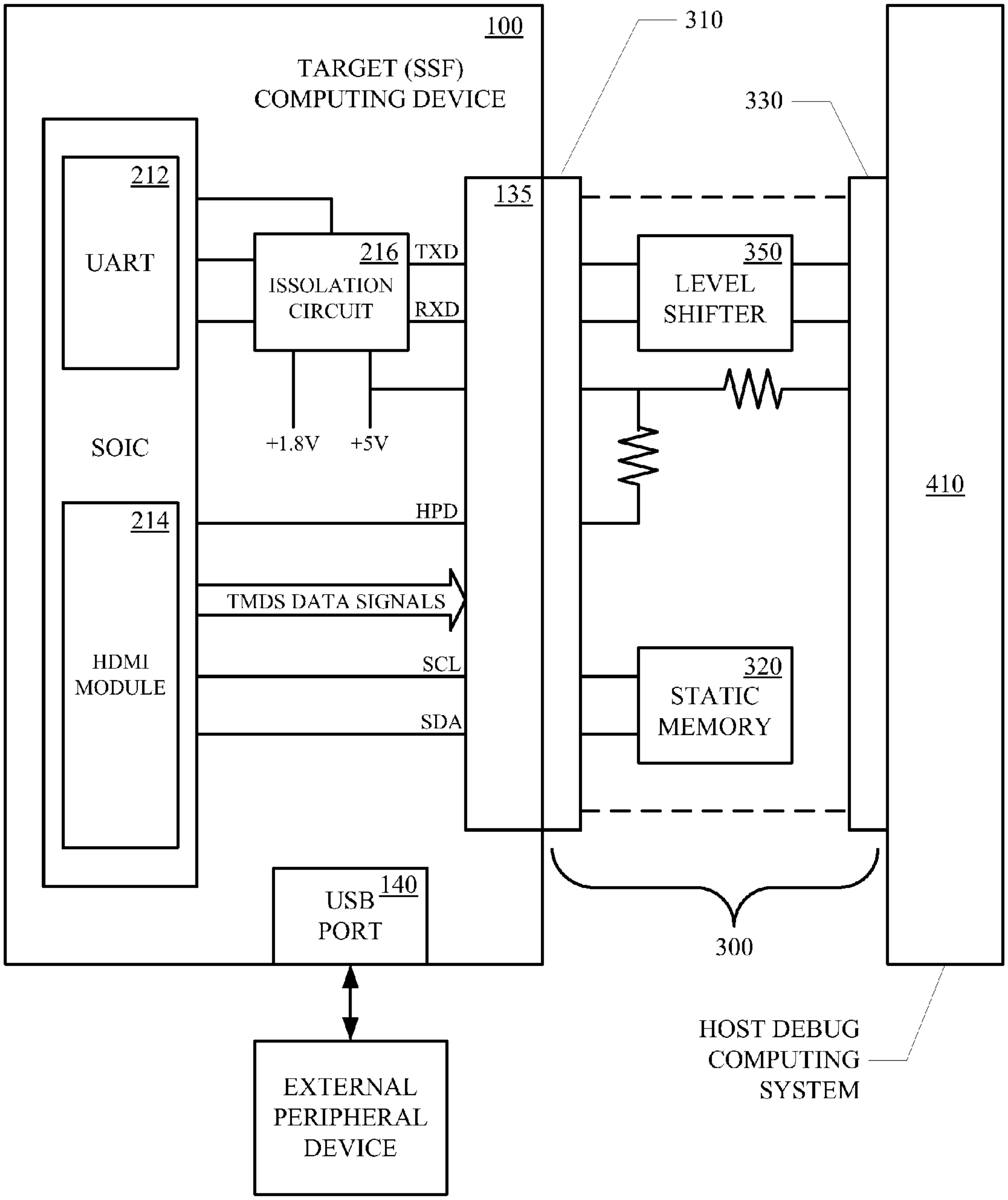
FIG. 4 shows a muxed HDMI for use in a debugging system, in accordance with one embodiment of the present technology.

Embodiments of the present technology will be further explained with reference to FIG. 4, which shows a muxed HDMI for use in a debugging system. The system includes a target computing device 100 communicatively coupled by an HDMI cable adapted for debugging 300 to a host debugging computing device 410. The target debug computing device 100 includes a single USB port 140, and an HDMI port 135. A muxed HDM1 controller 212-216 of the target computing device 110 detects a hot plug detect signal when the HIDMI cable adapted for debugging 300 is coupled to its HDM.I port 135. The conventional hot plug detection circuitry is used allowing unchanged design from a platform that does not support muxed HDMI debugging. In response to the HPD signal, the muxed HDMI controller 212-216 of the target computing device 100 reads an EDI D code across the SO, and SDA lines from a static memory 320 of the HDMI cable assembly 300, The unique EDID code indicates the presence of an HDMI cable adapted for debugging and/or a "debug" host device, and not a standard HDMI sink In addition to detecting that there is a HDMI cable adapted for debugging present, the static memory may optionally include information about the cable to allow for further configuration of the debug host 410.

In response to the "debug" cable/host device EDID code, the muxed HDMI controller 212-216 disables the TMDS data bus. The muxed HDMI controller 212-216 also enables transmission and receipt of debug commands and data across the consumer electronics control (CEC) line (e.g., serial output (TXD)) and the serial input (RXD) line, in response to the "debug" host mode/device EDID code. In such case the debugging computing device 410 may be acting substantially similar to a USB host and the target computing device 100 may be acting substantially similar to a USB slave/bridge device.

Accordingly, embodiments of the present technology advantageously allow debugging a device without increasing the number of USB ports that are on the chassis or affecting the final height (z) of the chassis.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A computing device comprising:

a high-definition multimedia interface (HDMI) port;

a high-definition multimedia interface (HDMI) module to detect an extended display identification data (EDID) code indicating a debug cable or debug host device coupled to the high-definition multimedia interface (HDMI) port, and to disable a display data channel (DDC) bus of the high-definition multimedia interface (HDMI) port in response to the extended display identification data (EDID) code indicating the debug cable or debug host device; and a universal asynchronous receiver and transceiver (UART) to transmit and receive debug commands and data on a serial input (RXD) and serial output (TXD) of the high-definition multimedia interface (HDMI) port, in response to the extended display identification data EDID) code indicating the debug cable or debug host device, wherein the computing device acts substantially similar to a universal serial bus (USB) slave bridge device.

2. The computing device of claim 1, wherein the high-definition multimedia interface (HDMI) module detects a hot plug detect signal on the high-definition multimedia interface (HDMI) port and detects the extended display identification data (EDID) code in response to the hot plug, detect signal.

3. The computing device of claim 1, wherein the universal asynchronous receiver and transceiver (UART) is a 16550 compatible universal asynchronous receiver and transceiver (UART).

4. The computing device of claim 1, further comprising an isolation circuit coupled on the serial input (RXD) and serial output (TXD) between the universal asynchronous receiver and transceiver (UART) and the high-definition multimedia interface (HDMI) port.

5. The computing device of claim 1, further comprising signal level shift circuit coupled on the serial input (RXD) and serial output (TXD) between the universal asynchronous receiver and transceiver (UART) and the high-definition multimedia interface (HDMI) port.

6. The computing device of claim 1, further comprising a single universal serial bus (USB) port.

7. A muxed high-definition multimedia interface (HDMI) controller comprising:

a means for detecting an extended display identification data (EDID) code indicating a debug cable or debug host device coupled to the high-definition multimedia interface (HDMI) port of a computing device;

a means for disabling a display data channel (DDC) bus of the high-definition multimedia interface (HDMI) port in response to the extended display identification data (EDID) code indicating the debug cable or debug host device; and a means for transmitting and receiving debug commands and data on a serial input (RXD) and serial output (TXD) of the high-definition multimedia interface (HDMI) port in response to the extended display identification data (EDID) code indicating the debug cable or debug host device.

8. The muxed high-definition multimedia, interface (HDMI) controller according to claim 7, further comprising:

a means for detecting, a hot plug detect signal on the high-definition multimedia interface (HDMI) port; and the means for detecting the extended display identification data (EDID) code indicating the debug cable or debug host device in response to the hot plug detect signal.

9. The muxed high-definition multimedia interface (HDMI) controller according to claim 8, further comprising a means for isolating signals on the serial input (RXD) and serial output (TXD).

10. The muxed high-definition multimedia interface (HDMI) controller according to claim 8, further comprising a means for level shifting signals on the serial input (TXD) and serial output (TXD).

11. A high-definition multimedia interface (HDMI) controller comprising:

a high-definition multimedia interface (HDMI) module to detect a hot plug detect signal, to detect an extended display identification data (EDID) code indicating a debug cable or debug host device in response to the hot plug detect signal, and to disable a display data channel (DDC) bus in response to the extended display identification data (EDID) code indicating the debug cable or debug host device; and a universal asynchronous receiver and transceiver (UART) to transmit and receive debug commands and data on a serial input (RXD) and serial output (TXD) in response to the extended display identification data (EDID) code indicating the debug cable or debug host device.

12. The high-definition multimedia interface (HDMI) controller of claim 11, wherein the hot plug detect signal is detected from a HDMI cable providing a pull-up from a power line of the high-definition multimedia interface (HDMI) controller to a hot plug detect line of the high-definition multimedia interface (HDMI) controller.

13. The high-definition multimedia interface (HDMI) controller of claim 12, wherein extended display identification data (EDID) code is detected from a static memory of the HDMI cable across a serial clock line (SCL) and serial data line (SDL) of the high-definition multimedia interface (HDMI) controller.

14. The high-definition multimedia interface (HDMI) controller of claim 13, further comprising an isolation/level shifter circuit coupled on the serial input (RXD) and serial output (TXD) of the high-definition multimedia interface (HDMI) controller.

* * * * *